(12) United States Patent
Kanatani et al.

(10) Patent No.: US 8,242,687 B2
(45) Date of Patent: Aug. 14, 2012

(54) ORGANIC EL DISPLAY WITH A COLOR FILTER HAVING A BLACK MATRIX AND METHOD OF MANUFACTURING THE SAME

(75) Inventors: Kunimichi Kanatani, Osaka (JP); Seiji Takagi, Osaka (JP)

(73) Assignee: Panasonic Corporation, Osaka (JP)

( * ) Notice: Subject to any disclaimer, the term of this patent is extended or adjusted under 35 U.S.C. 154(b) by 30 days.

(21) Appl. No.: 12/992,157

(22) PCT Filed: May 6, 2010

(86) PCT No.: PCT/JP2010/003105
§ 371 (c)(1),
(2), (4) Date: Nov. 11, 2010

(87) PCT Pub. No.: WO2010/128593
PCT Pub. Date: Nov. 11, 2010

(65) Prior Publication Data
US 2011/0101857 A1    May 5, 2011

(30) Foreign Application Priority Data
May 8, 2009 (JP) ................. 2009-113106

(51) Int. Cl.
*H01L 51/50* (2006.01)
(52) U.S. Cl. ......................... 313/504; 445/24
(58) Field of Classification Search .............. None
See application file for complete search history.

(56) References Cited

U.S. PATENT DOCUMENTS

| | | |
|---|---|---|
| 2001/0033350 A1 | 10/2001 | Kobayashi et al. |
| 2005/0179368 A1 | 8/2005 | Ryu et al. |
| 2008/0036367 A1 | 2/2008 | Eida et al. |
| 2008/0284331 A1 | 11/2008 | Hayashi |

FOREIGN PATENT DOCUMENTS

| | | |
|---|---|---|
| JP | 04-277720 | 10/1992 |
| JP | 2001-075066 | 3/2001 |
| JP | 2001-264720 | 9/2001 |
| JP | 2004-311305 | 11/2004 |
| JP | 2005-209651 | 8/2005 |
| JP | 2007-257907 | 10/2007 |
| JP | 2008-288012 | 11/2008 |
| WO | 2006/022123 | 3/2006 |

*Primary Examiner* — Anh Mai
*Assistant Examiner* — Britt D Hanley
(74) *Attorney, Agent, or Firm* — Hamre, Schumann, Mueller & Larson, P.C.

(57) ABSTRACT

An object of the present invention is to provide an organic EL display that enables accurate measurement of the thickness of a transparent resin in an effective pixel area. The organic EL display of the present invention has a structure in which an organic EL device (21) having a plurality of partitions (25) placed at intervals in a predetermined direction and an organic light emitting layer (26) provided between the adjacent partitions (25), and a color filter (22) having a black matrix (29) and a pigment layer (30) placed in each of frames of the black matrix (29) are bonded via a transparent resin (31), and a light transmissive opening (33) is provided in a section of the black matrix (29) other than a section facing the partition (25).

9 Claims, 7 Drawing Sheets

ORGANIC EL DISPLAY WITH A COLOR FILTER HAVING A BLACK MATRIX AND METHOD OF MANUFACTURING THE SAME

TECHNICAL FIELD

The present invention relates to an organic EL display and a method of manufacturing the organic EL display, and particularly to an organic EL display panel having a top emission structure in which an organic EL device and a color filter are bonded via a transparent resin.

BACKGROUND ART

The configuration of a general organic EL display panel having a top emission structure is shown in FIG. 5. FIG. 5(a) is a plan view of the general organic EL display panel having a top emission structure, and FIG. 5(b) is a sectional view taken along line A1-A1 in FIG. 5(a).

Generally, in an organic EL display panel having a top emission structure, a color filter 2 is placed on the lighting surface of an organic EL device 1. The lighting surface of the organic EL device is a surface from which light is emitted.

The organic EL device 1 has a structure in which a lower electrode 4 is provided on a substrate 3, and organic light emitting layers 6 in three primary colors are held between the lower electrode 4 and an upper electrode 7. The adjacent organic light emitting layers 6 are separated by light emitting layer partitions 5. Meanwhile, the color filter 2 has a structure in which a grid black matrix 9 is provided on a transparent substrate 8, and pigment layers 10 in three primary colors are placed in the frames of the black matrix 9. The color filter 2 is placed on the organic EL device 1 in a state where the surface of the color filter 2 on the side of the black matrix 9 faces the organic EL device 1. The transparent substrate 8 is, for example, a glass substrate.

The organic light emitting layers 6 in three primary colors include a red light emitting layer, a blue light emitting layer, and a green light emitting layer. The organic light emitting layers 6 in these colors are repeatedly placed in a first direction. The organic light emitting layers 6 in the same color are placed in a second direction perpendicular to the first direction. As shown in FIG. 5(a), the pigment layers 10 in three primary colors include a red pigment layer 10a, a blue pigment layer 10b, and a green pigment layer 10c. The pigment layers 10 in these colors are repeatedly placed in the first direction. The pigment layers 10 in the same color are placed in the second direction.

The pigment layers 10 in three primary colors are provided to adjust the chromaticity of light beams in three primary colors emitted from the organic light emitting layers 6 in three primary colors. The black matrix 9 is provided to prevent the color mixture of the light beams in three primary colors emitted from the organic light emitting layers 6 in three primary colors. The black matrix 9 and the pigment layers 10 are provided over an effective pixel area that displays images in an organic EL display panel.

The organic EL device 1 and the color filter 2 are bonded by a transparent resin 11. With the transparent resin 11, the light beams in three primary colors emitted from the organic light emitting layers 6 reach the pigment layers 10 without a reduction in the amount of light. The transparent resin 11 also has a function of protecting the organic light emitting layers 6 from being deteriorated by oxygen or water.

In the organic EL display panel, in order to prevent color shading, the thickness of the transparent resin 11, which determines a distance between the organic light emitting layer 6 in the organic EL device 1 and the pigment layer 10 in the color filter 2, needs to be set within a predetermined acceptable range.

For example, Patent Literature 1 has proposed a technique of setting the thickness of the transparent resin 11 by, as shown in FIG. 6, diffusing and mixing spherical spacers 12 in a transparent resin layer. FIG. 6 shows the configuration of a conventional organic EL display panel in which the spherical spacers are diffused and mixed in the transparent resin layer. Specifically, FIG. 6(a) is a plan view of the organic EL display panel, FIG. 6(b) is a sectional view taken along line A2-A2 in FIG. 6(a), and FIG. 6(c) is a sectional view taken along line A3-A3 in FIG. 6(a). In FIG. 6, the same components as those in FIG. 5 are denoted by the same reference numerals.

Further, for example, Patent Literature 2 has proposed another technique of setting the thickness of the transparent resin 11 by, as shown in FIG. 7, providing a rod-like spacer 13 between the organic EL device 1 and the color filter 2. FIG. 7 shows the configuration of a conventional organic EL display panel in which the rod-like spacer is provided between the organic EL device and the color filter. Specifically, FIG. 7(a) is a plan view of the organic EL display panel, FIG. 7(b) is a sectional view taken along line A4-A4 in FIG. 7(a), and FIG. 7(c) is a sectional view taken along line A5-A5 in FIG. 7(a). In FIG. 7, the same components as those in FIG. 5 are denoted by the same reference numerals. The rod-like spacer 13 is provided on the color matrix 9.

CITATION LIST

Patent Literature

Patent Literature 1: Japanese Patent Laid-Open No. 2007-257907
Patent Literature 2: Japanese Patent Laid-Open No. 2004-311305

SUMMARY OF INVENTION

Technical Problem

As described above, in the conventional organic EL display panel, the spherical spacers are diffused and mixed in the transparent resin layer or the rod-like spacer is provided between the organic EL device and the color filter to set the thickness of the transparent resin.

However, by the above-described methods of setting the thickness of the transparent resin, when the organic EL device and the color filter are bonded by vacuum bonding, it is possible to prevent the thickness of the transparent resin from reaching a predetermined thickness or less, but it is impossible to prevent the thickness of the transparent resin from reaching a predetermined thickness or more. Thus, it is necessary to measure the thickness of the transparent resin after the organic EL device and the color filter are bonded, and check whether the thickness of the transparent resin is within a predetermined acceptable range. If the thickness of the transparent resin falls outside the predetermined acceptable range, color shading occurs. Thus, when manufacturing organic EL display panels, the thickness control of the transparent resin is important.

The thickness of the transparent resin can be measured by applying a measuring light beam to the transparent resin layer. Specifically, the measuring light beam is applied to the transparent resin layer to obtain light beams reflected from the upper and lower interfaces of the transparent resin layer, and the thickness of the transparent resin is measured using the reflected light beams. However, in the conventional organic EL display panel having a top emission structure, disadvantageously, the thickness of the transparent resin cannot be measured stably or at all. This is because the black matrix or the pigment layer reduces the amount of measuring light, so that the amount of light reflected from the upper and lower interfaces of the transparent resin layer becomes insufficient for measurement. The amount of measuring light is reduced because in the conventional organic EL display panel having a top emission structure, the measuring light passes through the black matrix and the pigment layer when the thickness of the transparent resin provided on the lower side of the color filter is measured by applying the measuring light from the side of the color filter.

To solve this problem, as shown in FIG. 8, a method is possible which includes providing a simulated pattern 16 in an area other than an effective pixel area 15 of an organic EL display panel 14, measuring the thickness of a transparent resin in the area where the simulated pattern 16 is provided, and estimating the thickness of the transparent resin in the effective pixel area 15. In this method of measuring the thickness of the transparent resin, measuring light is applied to an area other than the effective pixel area 15 where a black matrix and a pigment layer are placed. This does not reduce the amount of measuring light. Thus, the amount of light reflected from the upper and lower interfaces of a transparent resin layer is sufficient for measurement. However, this method is possible on the assumption that the thickness of the transparent resin of the effective pixel area 15 is the same as the thickness of the transparent resin of the area where the simulated pattern 16 is placed. Thus, this method has a problem in accuracy as compared with a method of directly measuring the thickness of the transparent resin of the effective pixel area 15.

An object of the present invention is to solve the above-described problem. Specifically, the object of the present invention is to provide an organic EL display and a method of manufacturing the organic EL display that enable accurate measurement of the thickness of a transparent resin in an effective pixel area.

Solution to Problem

To achieve the above-described object, an organic EL display of the present invention includes: an organic EL device having a plurality of partitions placed at intervals in a predetermined direction, an organic light emitting layer provided between the adjacent partitions, a lower electrode, and an upper electrode holding the organic light emitting layer together with the lower electrode; a color filter having a black matrix and a pigment layer placed in each of frames of the black matrix; and a transparent resin placed between the organic EL device and the color filter, the organic EL device and the color filter being bonded via the transparent resin, wherein a light transmissive opening is provided in a section of the black matrix other than a section facing the partition.

According to the organic EL display having such a configuration, in the manufacturing process of the organic EL display, a measuring light beam is applied to the opening provided in the black matrix, so that light beams reflected from the transparent resin near pixels in an effective pixel area can be observed without reducing the amount of the measuring light beam. Thus, the thickness of the transparent resin near the pixels in the effective pixel area can be accurately measured, thereby manufacturing an organic EL display without color shading. Further, the opening may be simply provided in the black matrix, thereby manufacturing the organic EL display at low cost.

According to another aspect of the present invention, the opening is provided between the pigment layers in the same color in the organic EL display of the present invention. This configuration can prevent light beams in different colors having leaked through the opening from being mixed, thereby providing an organic EL display without color shading or color mixture.

According to another aspect of the present invention, the opening has a rectangular or an oval shape as viewed in a plan view in the organic EL display of the present invention. In this configuration, it is not necessary to perform relative positioning accurately between the application position of the measuring light beam and the position of the opening. Thus an inexpensive positioning apparatus can be used, and an organic EL display can be manufactured at low cost.

According to another aspect of the present invention, the opening is provided in a broken manner in the organic EL display of the present invention. In this configuration, it is not necessary to perform relative positioning of the measuring light beam accurately, and the amount of light leaking through the opening can be reduced. Thus the organic EL display can be manufactured at low cost without color shading or color mixture.

According to another aspect of the present invention, a wall portion protruding toward the organic EL device is provided around the opening of the black matrix in the organic EL display of the present invention. This configuration can reliably reduce light from leaking through the opening, and can provide an organic EL display without color shading or color mixture.

A method of manufacturing an organic EL display according to the present invention, the organic EL display including: an organic EL device having a plurality of partitions placed at intervals in a predetermined direction, an organic light emitting layer provided between the adjacent partitions, a lower electrode, and an upper electrode holding the organic light emitting layer together with the lower electrode; a color filter having a black matrix and a pigment layer placed in each of frames of the black matrix; and a transparent resin placed between the organic EL device and the color filter, the organic EL device and the color filter being bonded via the transparent resin, wherein a light transmissive opening is formed in a section of the black matrix other than a section facing the partition when or after the black matrix is prepared.

According to another aspect of the present invention, after the organic EL device and the color filter are bonded, a measuring light beam is applied to the transparent resin through the opening formed in the black matrix, and the thickness of the transparent resin is measured using a light beam reflected from the transparent resin, in the method of manufacturing an organic EL display of the present invention.

According to another aspect of the present invention, a wall portion protruding toward the organic EL device is formed around the opening of the black matrix when or after the black matrix is prepared, in the method of manufacturing an organic EL display of the present invention.

Advantageous Effects of Invention

According to preferred embodiments of the present invention, the thickness of a transparent resin in an effective pixel area can be accurately measured, and an organic EL display without color shading can be produced at low cost.

BRIEF DESCRIPTION OF DRAWINGS

FIG. 1 shows the configuration of an organic EL display panel according to Embodiment 1 of the present invention, wherein specifically.

FIG. 4 shows the configuration of an organic EL display panel according to Embodiment 2 of the present invention, wherein specifically.

FIG. 5 is an explanatory diagram of a general organic EL display panel having a top emission structure, wherein specifically.

FIG. 6 shows the configuration of a conventional organic EL display panel in which spherical spacers are diffused and mixed in a transparent resin layer, wherein specifically.

FIG. 7 shows the configuration of a conventional organic EL display panel in which a rod-like spacer is provided between an organic EL device and a color filter, wherein specifically.

DESCRIPTION OF EMBODIMENTS

Figure 1A:
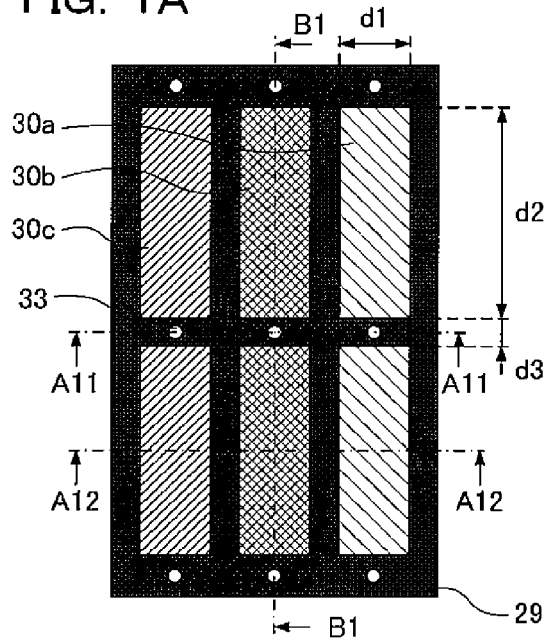
FIG. 1(a) is a plan view of the organic EL display panel according to Embodiment 1 of the present invention.
Figure 1B:
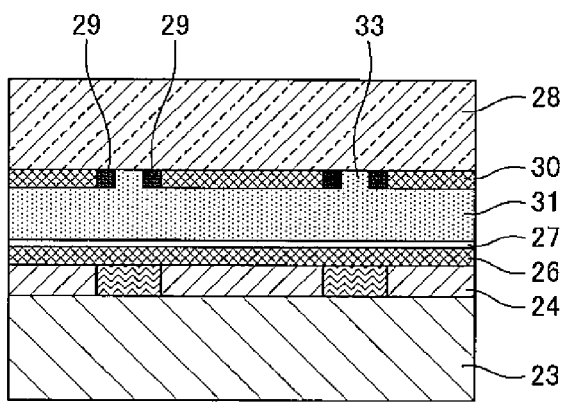
FIG. 1(b) shows a part of a section taken along line B1-B1 in FIG. 1(a)
Figure 1C:
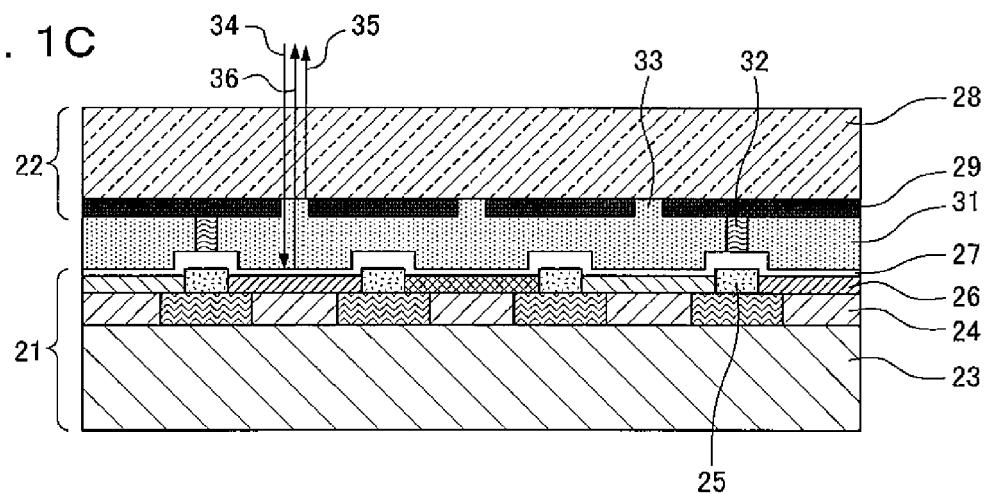
FIG. 1(c) is a sectional view taken along line A11-A11 in FIG. 1(a)
Figure 1D:
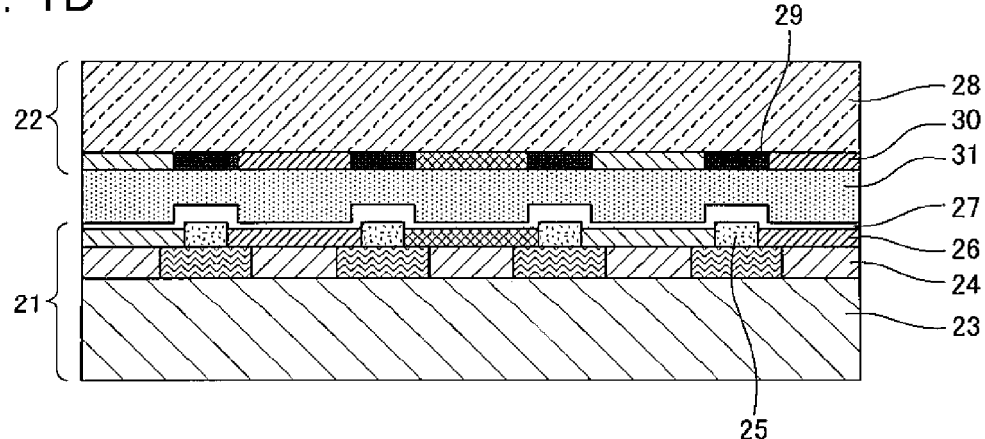
FIG. 1(d) is a sectional view taken along line A12-A12 in FIG. 1(a).

Now, an organic EL display panel having a top emission structure according to embodiments of the present invention will be described with reference to the drawings. Components corresponding to the foregoing components are denoted by the same reference numerals and descriptions thereof will be omitted.

Embodiment 1

Figure 2:
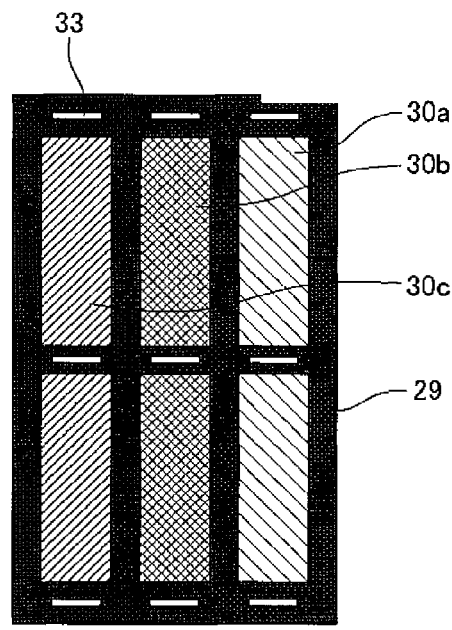
FIG. 2 is a plan view showing another example of the organic EL display panel according to Embodiment 1 of the present invention.
Figure 3:
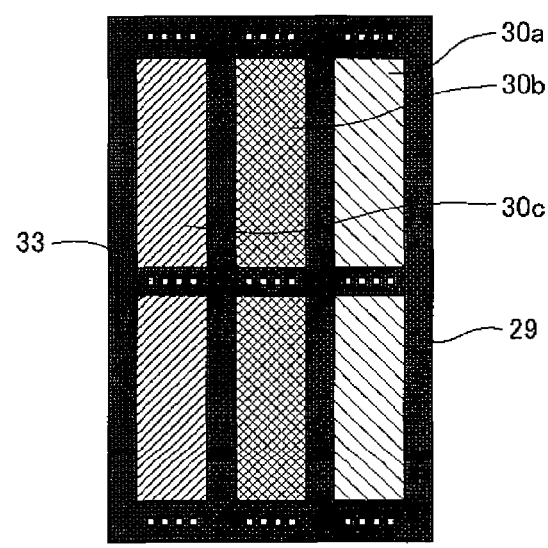
FIG. 3 is a plan view showing another example of the organic EL display panel according to Embodiment 1 of the present invention.
Figure 4A:
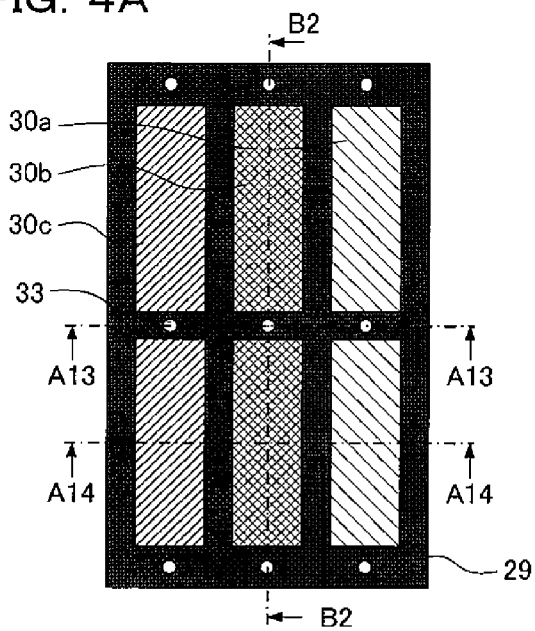
FIG. 4(a) is a plan view of the organic EL display panel according to Embodiment 2 of the present invention.
Figure 4B:
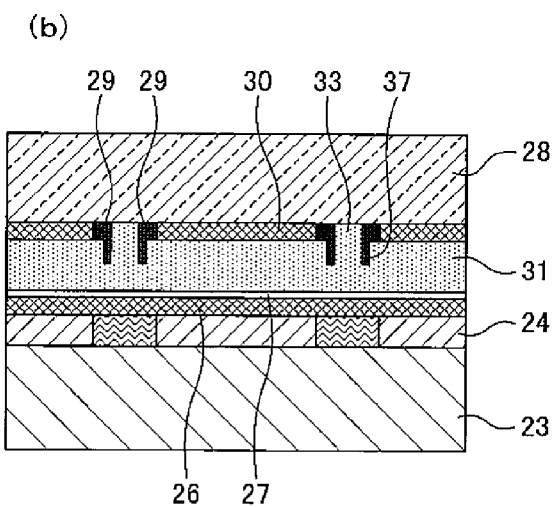
FIG. 4(b) shows a part of a section taken along line B2-B2 in FIG. 4(a)
Figure 4C:
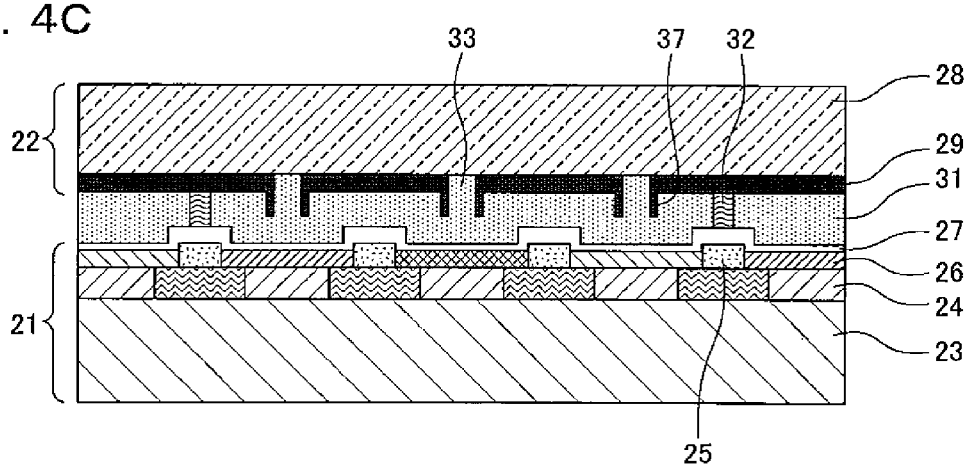
FIG. 4(c) is a sectional view taken along line A13-A13 in FIG. 4(a)
Figure 4D:
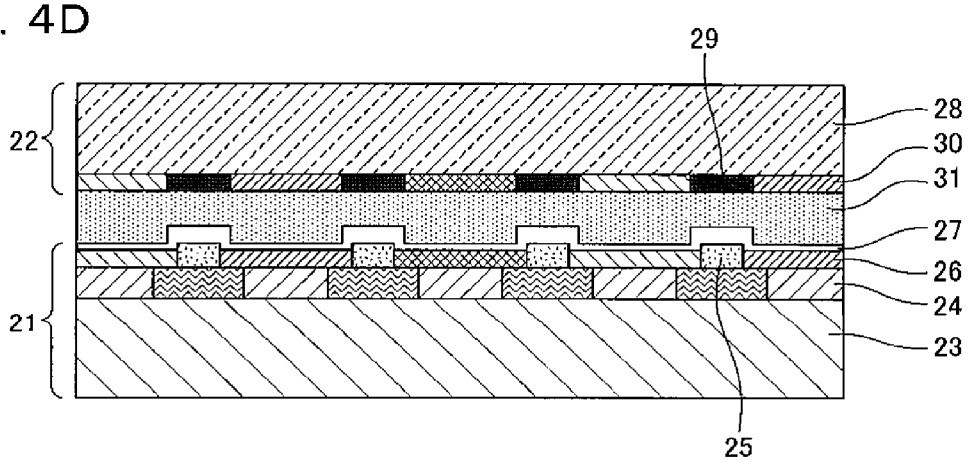
FIG. 4(d) is a sectional view taken along line A14-A14 in FIG. 4(a).
Figure 5A:
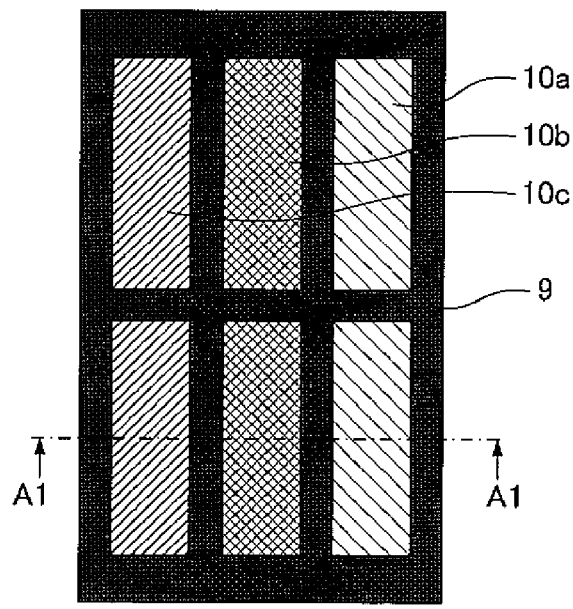
FIG. 5(a) is a plan view of the general organic EL display panel having a top emission structure.
Figure 5B:
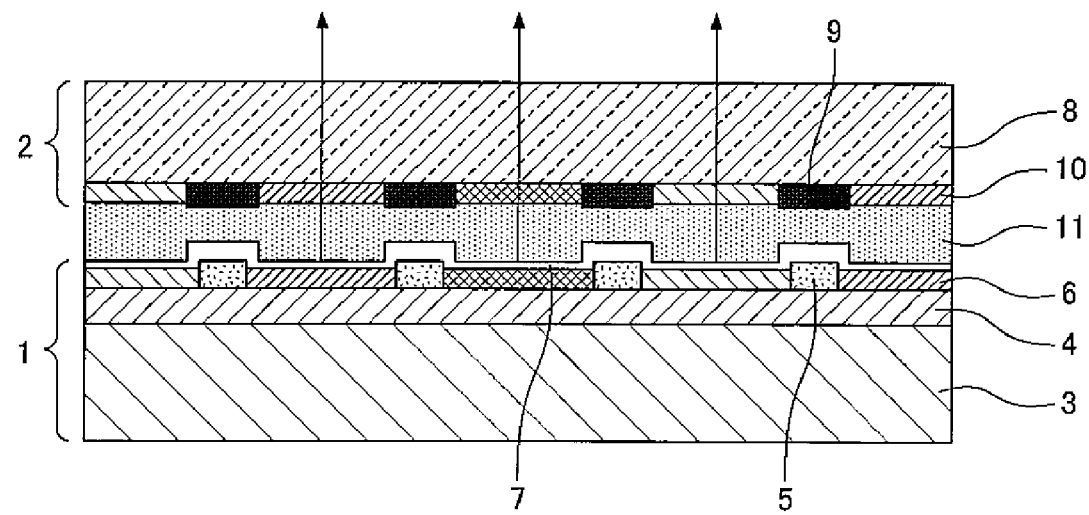
FIG. 5(b) is a sectional view taken along line A1-A1 in FIG. 5(a).
Figure 6A:
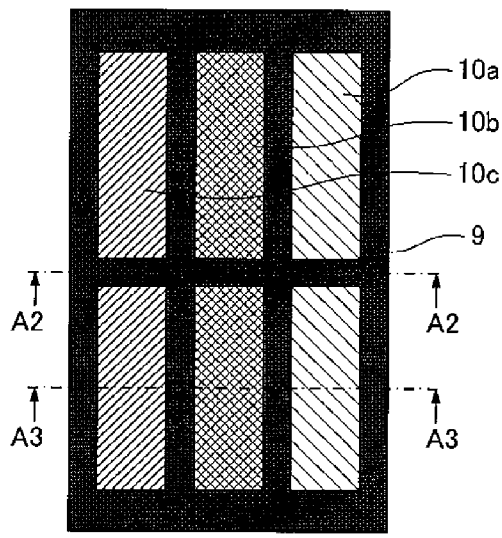
FIG. 6(a) is a plan view of the conventional organic EL display panel in which the spherical spacers are diffused and mixed in the transparent resin layer.
Figure 6B:
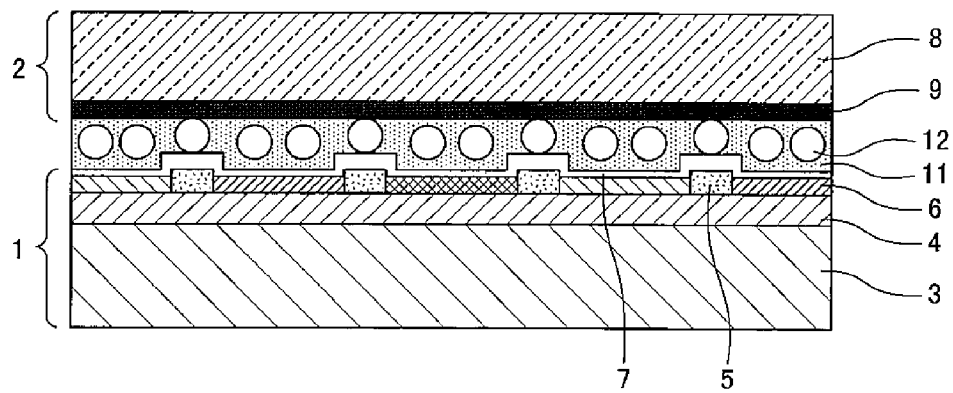
FIG. 6(b) is a sectional view taken along line A2-A2 in FIG. 6(a)
Figure 6C:
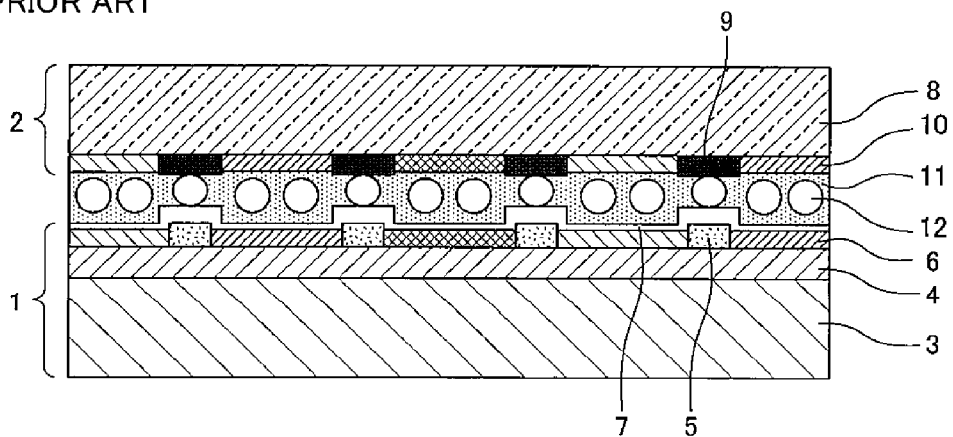
FIG. 6(c) is a sectional view taken along line A3-A3 in FIG. 6(a).
Figure 7A:
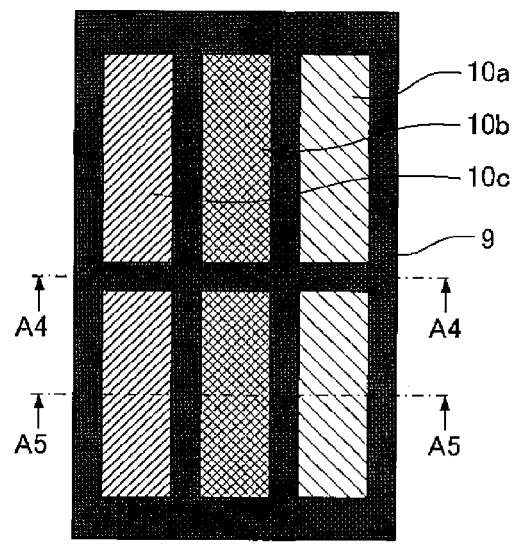
FIG. 7(a) is a plan view of the conventional organic EL display panel in which the rod-like spacer is provided between the organic EL device and the color filter.
Figure 7B:
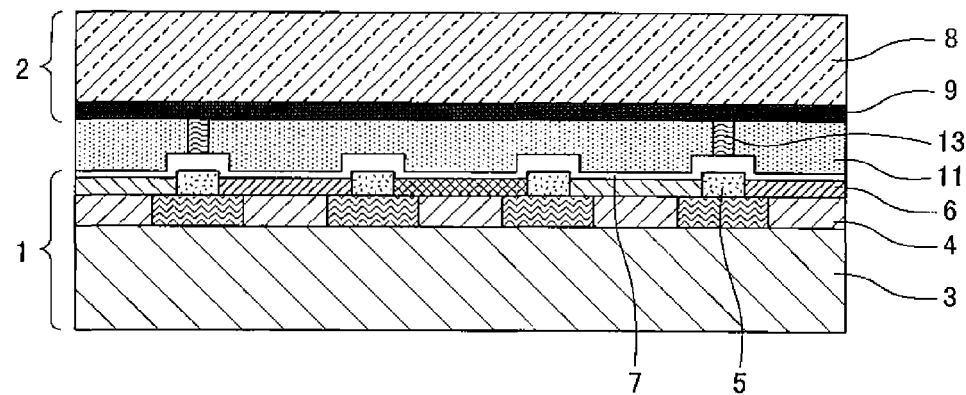
FIG. 7(b) is a sectional view taken along line A4-A4 in FIG. 7(a)
Figure 7C:
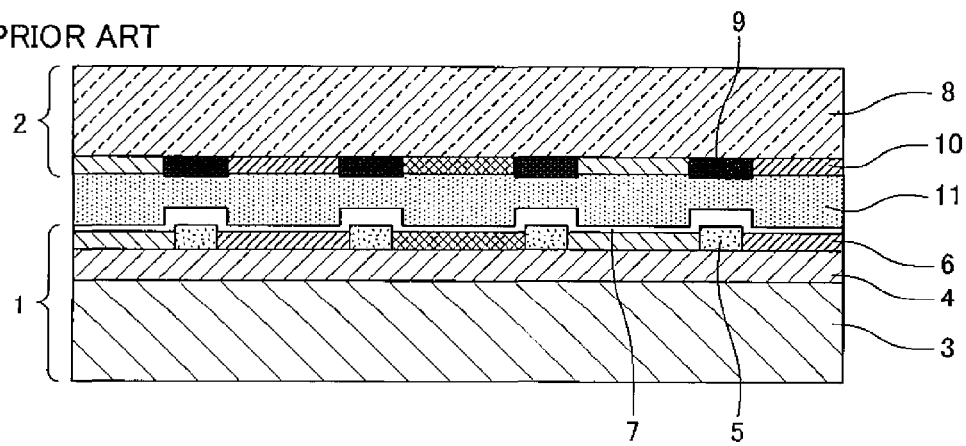
FIG. 7(c) is a sectional view taken along line A5-A5 in FIG. 7(a).
Figure 8:
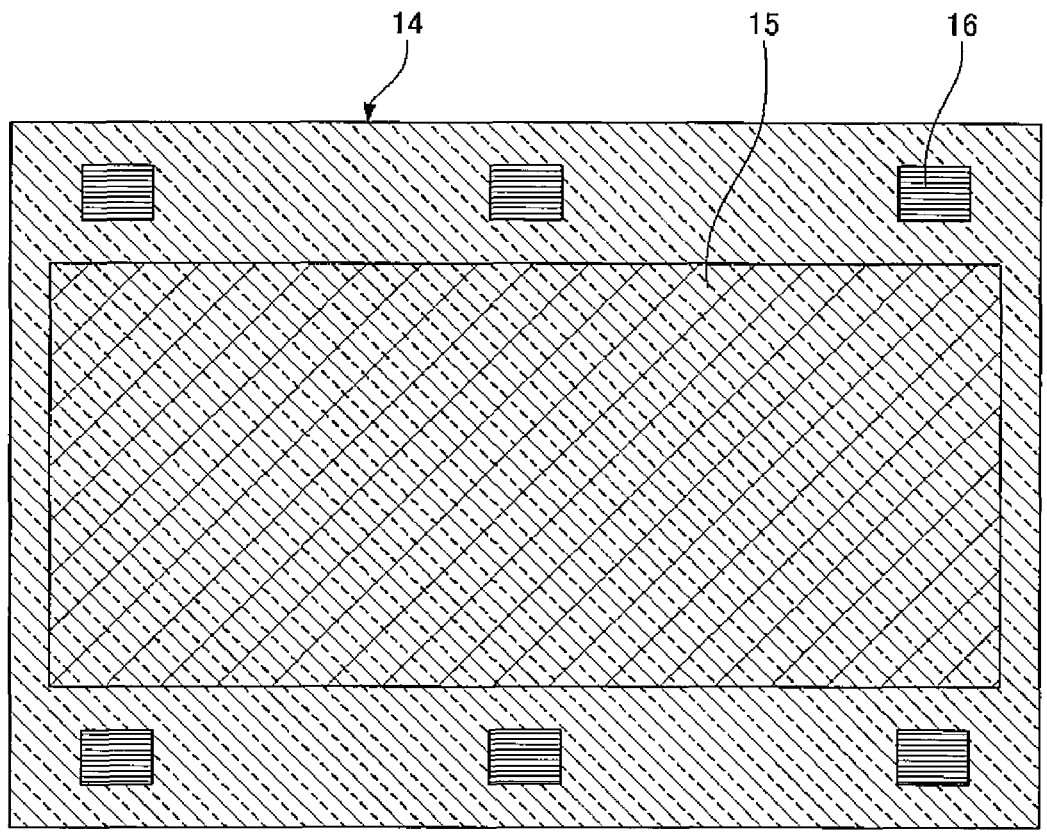
FIG. 8 is an explanatory diagram of an organic EL display panel having a top emission structure in which a simulated pattern for measuring the thickness of a transparent resin is provided in an area other than an effective pixel area.

FIG. 1 shows the configuration of an organic EL display panel of Embodiment 1. Specifically, FIG. 1(a) is a plan view of the organic EL display panel, FIG. 1(b) shows a part of a section taken along line B1-B1 in FIG. 1(a), FIG. 1(c) is a sectional view taken along line A11-A11 in FIG. 1(a), and FIG. 1(d) is a sectional view taken along line A12-A12 in FIG. 1(a). FIGS. 2 and 3 are plan views showing other examples of the organic EL display panel of Embodiment 1 of the present invention. In FIGS. 2 and 3, components corresponding to those in FIG. 1 are denoted by the same reference numerals.

In this organic EL display panel, a color filter 22 is placed on the lighting surface of an organic EL device 21. The organic EL device 21 has a structure in which a lower electrode 24 is patterned on a substrate 23, and an organic light emitting layer 26 is held between the lower electrode 24 and an upper electrode 27. The substrate 23 has, for example, a structure in which a TFT circuit or a planarizing layer is stacked on glass. The patterned lower electrode 24 functions as a pixel.

In the organic EL device 21, a plurality of light emitting layer partitions 25 are placed at predetermined intervals in a first direction, and the adjacent organic light emitting layers 26 are separated by the light emitting layer partitions 25. Specifically, each organic light emitting layer 26 is provided between the adjacent light emitting layer partitions 25. The light emitting layer partitions 25 may extend in a second direction perpendicular to the first direction.

The organic light emitting layers 26 in three primary colors include a red light emitting layer, a blue light emitting layer, and a green light emitting layer. The organic light emitting layers 26 in these colors are repeatedly placed in the first direction. The organic light emitting layers 26 in the same color are placed in the second direction. The organic light emitting layers 26 in three primary colors are provided over an effective pixel area.

Meanwhile, the color filter 22 has a structure in which a grid black matrix 29 is provided on a transparent substrate 28, and pigment layers 30 in three primary colors are placed in the frames of the black matrix 29. The color filter 22 is placed on the organic EL device 21 in a state where the surface of the color filter 22 on the side of the black matrix 29 faces the organic EL device 21. The transparent substrate 28 may be, for example, a glass substrate.

The pigment layers 30 in three primary colors in the frames include, as shown in FIG. 1(a), a red pigment layer 30a, a blue pigment layer 30b, and a green pigment layer 30c. The pigment layers 30 in these colors are repeatedly placed in the first direction. The pigment layers 30 in the same color are placed in the second direction. The black matrix 29 and the pigment layers 30 in three primary colors are provided over the effective pixel area. The thicknesses of the red pigment layer 30a, the blue pigment layer 30b, and the green pigment layer 30c are 0.5 μm to 2 μm. All the pigment layers 30 may have the same thickness, or the pigment layers 30 may have different thicknesses depending on the colors.

In FIG. 1(a), d1 denotes the width of the pigment layer 30, d2 denotes the length of the pigment layer 30, and d3 denotes the width of the frame of the black matrix 29. The width d1 of the pigment layer 30 is 30 μm to 120 μm, the length d2 of the pigment layer 30 is 50 μm to 200 μm, and the width d3 of the frame of the black matrix 29 is 40 μm to 80 μm. The thickness of the black matrix 29 is 1 μm to 3 μm.

The organic EL device 21 and the color filter 22 are bonded by a transparent resin 31. The substrate 23 in the organic EL device 21 and the transparent substrate 28 in the color filter 22 each have an alignment mark. With the alignment mark, the organic light emitting layers 26 in the respective colors placed in the organic EL device 21 and the pigment layers 30 in the respective colors placed in the color filter 22 can be aligned in the same color, and the organic EL device 21 and the color filter 22 can be bonded via the transparent resin 31.

The transparent resin 31 may be an epoxy resin. The thickness of the transparent resin 31 is 5 μm to 20 μm. If the thickness of the transparent resin 31 is outside a predetermined acceptable range, color shading occurs. Thus, when manufacturing organic EL display panels, the thickness control of the transparent resin is important. Thus, it is necessary to measure the thickness of the transparent resin 31 after the organic EL device 21 and the color filter 22 are bonded, and check whether the thickness of the transparent resin 31 is within the predetermined acceptable range. The acceptable range of the thickness is ±5% to ±10%.

In the organic EL display panel, a rod-like spacer 32 is provided between the organic EL device 21 and the color filter 22 in order to set the thickness of the transparent resin 31 within the predetermined acceptable range. The spacer 32 is provided on the color matrix 29.

Further, in the organic display panel, a light transmissive opening 33 is provided in a section of the black matrix 29 other than a section facing the light emitting layer partition 25. As shown in FIG. 1, the opening 33 is desirably formed in the middle between the adjacent pigment layers 30. This can reduce the amount of light from the organic light emitting layer 26 leaking through the opening 33. Further, the opening 33 is herein formed between the pigment layers 30 in the same color, thereby preventing light beams in different colors having leaked through the opening 33 from being mixed. Thus, an organic EL display panel without color shading or color mixture can be provided.

The manufacturing process of the organic display panel includes applying a measuring light beam 34 to the transparent resin 31 through the opening 33 provided in the black matrix 29, and measuring the thickness of the transparent resin 31 using light beams reflected from the upper and lower interfaces of the transparent resin 31.

The thickness of the transparent resin 31 may be measured by, for example, optical interferometry or a confocal method. In either method, a measuring light beam is applied to the inside of a layer to be measured, and the thickness is measured using light beams reflected from the upper and lower interfaces of the layer to be measured.

In optical interferometry, the thickness of the transparent resin 31 is calculated using the interference waveforms of a light beam 35 reflected from the upper interface of a transparent resin layer and a light beam 36 reflected from the lower interface of the transparent resin layer. As a measuring light beam in the optical interferometry, a white light beam having a wavelength of 200 nm to 800 nm may be used.

In a confocal method, the thickness of the transparent resin 31 is calculated using a difference between the confocal position of a light beam 35 reflected from the upper interface of a transparent resin layer and the confocal position of a light beam 36 reflected from the lower interface of the transparent resin layer. As a measuring light beam in the confocal method, a laser light beam having a wavelength of 300 nm to 600 nm may be used.

Such thickness measurement by the optical interferometry or the confocal method is a non-destructive inspection, and a total inspection can be performed. This enables early detection of defects in the manufacturing process, increases yields, and reduces manufacturing costs.

As described above, in the organic display panel of Embodiment 1, the light transmissive opening 33 is formed in the section of the black matrix 29 other than the section facing the light emitting layer partition 25. Thus, in the manufacturing process of the organic display panel, the measuring light beam 34 is applied to the opening 33, and thus the light beams 35 and 36 reflected from the transparent resin 31 near pixels in the effective pixel area can be observed without reducing the amount of the measuring light beam 34. Thus, the thickness of the transparent resin 31 of the effective pixel area can be accurately measured, and an organic EL display panel without color shading can be produced. Further, the opening 33 may be simply provided in the black matrix 29, thereby manufacturing an organic EL display at low cost.

Next, another example of the light transmissive opening 32 provided in the black matrix 29 will be described. FIG. 1 shows the opening 33 having a circular shape as viewed in a plan view, but as shown in FIG. 2, an opening 33 having a rectangular or an oval shape as viewed in a plan view may be provided. In this configuration, it is not necessary to perform relative positioning accurately between the application position of the measuring light beam and the position of the opening 33. Specifically, even if the application position of the measuring light beam is slightly displaced in the longitudinal direction of the rectangular or oval opening 33, a reflected light beam can be observed. This enables the use of an inexpensive positioning apparatus, and the manufacture of the organic EL display panel at low cost.

Further, as shown in FIG. 3, the opening 33 may be provided in a broken manner. In this configuration, it is not necessary to perform relative positioning of the measuring light beam accurately, and the amount of light leaking through the opening 33 can be reduced. Specifically, even if the application position of the measuring light beam is slightly displaced in a broken direction, a reflected light beam can be observed, thereby eliminating the need to perform relative positioning of the measuring light beam accurately. This enables the use of an inexpensive positioning apparatus, and the manufacture of an organic EL display panel at low cost. Further, the amount of light leaking is reduced, and thus an organic EL display panel without color shading or color mixture can be provided. This configuration is effective when the spot diameter of the measuring light beam is larger than one tenth of the width of the frame of the black matrix 29.

The light transmissive opening 33 described above may be prepared by appropriately selecting a photomask pattern when the black matrix 29 is prepared by, for example, photolithography. Alternatively, the opening 33 may be prepared by partially removing the black matrix 29 with a laser light beam or plasma after the preparation of the black matrix 29.

Embodiment 2

FIG. 4 shows the configuration of an organic EL display panel of Embodiment 2 of the present invention. Specifically, FIG. 4(a) is a plan view of the organic EL display panel, FIG. 4(b) shows a part of a section taken along line B2-B2 in FIG. 4(a), FIG. 4(c) is a sectional view taken along line A13-A13 in FIG. 4(a), and FIG. 4(d) is a sectional view taken along line A14-A14 in FIG. 4(a). In FIG. 4, components corresponding to those in FIG. 1 are denoted by the same reference numerals.

The organic EL display panel of Embodiment 2 is different from that of Embodiment 1 in that a wall portion 37 protruding toward an organic EL device 21 is provided around a light transmissive opening 33 of a black matrix 29.

The wall portion 37 is thus provided around the opening 33, thereby reliably reducing the amount of light leaking through the opening 33. Thus, an organic EL display panel without color shading and color mixture can be provided.

The wall portion 37 can be prepared by switching photomasks and performing a photolithography process twice when the black matrix 29 is prepared by, for example, photolithography.

The wall portion 37 may be made of a material different from that of the black matrix 29. In this case, the wall portion 37 is prepared after the black matrix 29 is prepared. For example, in the case where a spacer 32 is prepared by photolithography after the black matrix 29 is prepared, the wall portion 37 may be prepared simultaneously with the spacer 32.

INDUSTRIAL APPLICABILITY

The organic EL display and the method of manufacturing the organic EL display according to the present invention enable accurate measurement of the thickness of a transparent resin in an effective pixel area by an optical thickness measuring method, and thus are useful for manufacturing a panel such as an organic EL display panel including two sheets of glass bonded.

The invention claimed is:

1. An organic EL display comprising:
    an organic EL device having a plurality of partitions placed at intervals in a predetermined direction, an organic light emitting layer provided between the adjacent partitions, a lower electrode, and an upper electrode holding the organic light emitting layer together with the lower electrode;
    a color filter having a black matrix and a pigment layer, the black matrix having a frame and a first opening enclosed by the frame, the pigment layer placed in the first opening of the black matrix; and
    a transparent resin placed between the organic EL device and the color filter,
    the organic EL device and the color filter being bonded via the transparent resin,
    wherein a light transmissive second opening is provided in a section of the frame of the black matrix other than sections facing the plurality of partitions, and
    an area of the second opening is smaller than that of the first opening.

2. The organic EL display according to claim 1, wherein the color filter has a plurality of pigment layers in a first color and a color, and the second opening is provided between the pigment layers in the same color.

3. The organic EL display according to claim 1, wherein the second opening has a rectangular or an oval shape as viewed in a plan view.

4. The organic EL display according to claim 1, wherein the second opening is defined by a plurality of openings in a form of a broken line.

5. The organic EL display according to claim 1, wherein a wall portion protruding toward the organic EL device is provided around the second opening of the black matrix.

6. A method of manufacturing an organic EL display, the organic EL display comprising:
    an organic EL device having a plurality of partitions placed at intervals in a predetermined direction, an organic light emitting layer provided between adjacent partitions, a lower electrode, and an upper electrode holding the organic light emitting layer together with the lower electrode;
    a color filter having a black matrix and a pigment layer, the black matrix having a frame and a first opening enclosed by the frame, the pigment layer placed in the first opening of the black matrix; and
    a transparent resin placed between the organic EL device and the color filter,
    the organic EL device and the color filter being bonded via the transparent resin,
    wherein a light transmissive second opening is formed in a section of the frame of the black matrix other than sections facing the plurality of partitions when or after the black matrix is prepared, and
    an area of the second opening is smaller than that of the first opening.

7. The method of manufacturing an organic EL display according to claim 6, wherein after the organic EL device and the color filter are bonded, the measuring light beam is applied to the transparent resin through the second opening formed in the frame of the black matrix, and a thickness of the transparent resin is measured using a light beam reflected from the transparent resin.

8. The method of manufacturing an organic EL display according to claim 6, wherein a wall portion protruding toward the organic EL device is formed around the second opening of the black matrix when or after the black matrix is prepared.

9. The organic EL display according to claim 1, wherein a measuring light beam applied to the second opening does not pass through the pigment layer.

* * * * *

UNITED STATES PATENT AND TRADEMARK OFFICE
CERTIFICATE OF CORRECTION

| | |
|---|---|
| PATENT NO. | : 8,242,687 B2 |
| APPLICATION NO. | : 12/992157 |
| DATED | : August 14, 2012 |
| INVENTOR(S) | : Kanatani et al. |

It is certified that error appears in the above-identified patent and that said Letters Patent is hereby corrected as shown below:

Column 9, line 37 (Claim 2): after "and a" insert --second--.
Column 9, line 43 (Claim 4): after "openings" insert --arranged--.

Signed and Sealed this
Twenty-second Day of January, 2013

David J. Kappos
*Director of the United States Patent and Trademark Office*